United States Patent [19]
Ponte et al.

[11] Patent Number: 4,746,842
[45] Date of Patent: May 24, 1988

[54] CIRCUIT ARRANGEMENT FOR GENERATING A SAWTOOTH-SHAPED SIGNAL FOR THE FIELD DEFLECTION IN A PICTURE DISPLAY DEVICE

[75] Inventors: Edward M. Ponte; Steven J. van Raalte; Dirk J. A. Teuling, all of Eindhoven, Netherlands

[73] Assignee: U.S. Philips Corporation, New York, N.Y.

[21] Appl. No.: 918,416

[22] Filed: Oct. 14, 1986

[30] Foreign Application Priority Data

Oct. 14, 1985 [NL] Netherlands .......................... 8502801

[51] Int. Cl.$^4$ ........................ H01J 29/70; H01J 29/76
[52] U.S. Cl. ..................................... 315/403; 315/387
[58] Field of Search ....................... 315/403, 387, 389

[56] References Cited
U.S. PATENT DOCUMENTS 4,004,190 1/1977 Simpson .............................. 315/403
4,314,183 2/1982 Heuze et al. ........................ 315/389
4,490,653 12/1984 Olmstead ............................ 315/403

Primary Examiner—Theodore M. Blum
Attorney, Agent, or Firm—William J. Streeter; Gregory P. Gadson

[57] ABSTRACT

A circuit arrangement for generating a sawtooth-shaped signal for the field deflection in a picture display device with an amplitude which is substantially independent of the field frequency is disclosed. The value of the sawtooth-shaped signal during the occurrence of a sampling pulse is compared with a reference value for generating a control signal controlling the slope of the sawtooth-shaped signal. To eliminate instability in amplitude, which might result from phase jitter of the incoming field synchronizing signal and might cause an interlace error, sampling pulses are applied whose repetition frequency is substantially equal to the nth part of the field frequency, where n is an integer which is larger than 1, preferably a small multiple of 2.

6 Claims, 1 Drawing Sheet

CIRCUIT ARRANGEMENT FOR GENERATING A SAWTOOTH-SHAPED SIGNAL FOR THE FIELD DEFLECTION IN A PICTURE DISPLAY DEVICE

BACKGROUND OF THE INVENTION

The invention relates to a circuit arrangement for generating a sawtooth-shaped signal for the field deflection in a picture display device with an amplitude which is substantially independent of the field frequency, the circuit arrangement comprising a sawtooth generator which is triggerable by means of a field synchronizing signal and which has an output terminal for making the sawtooth-shaped signal available, and means for comparing the value of the sawtooth-shaped signal during the occurrence of a sampling pulse with a reference value and for applying a control signal to a control input of the sawtooth generator for controlling the slope of the generated sawtooth-shaped signal.

A circuit arrangement of this type is known from U.S. Pat. No. 4,490,653. In this known arrangement the amplitude of the generated sawtooth-shaped signal determining the height of the picture displayed on a display screen is maintained substantially constant at each value of the field frequency, for example, 50 or 60 Hz for the European or American television standard. Such a control must be fast: in fact, it is a requirement that upon switching on the picture display device the steady state of the control loop is achieved before the picture appears on the screen.

When the incoming field synchronizing signal has a phase jitter, the reaction speed of the amplitude control loop causes an instability in the picture height, which is troublesome. Such an instability occurs when a television signal is displayed which originates from a picture recording and display device for a special mode of this device, i.e. for example, at an accelerated or slow-motion display. In this case it appears that a field period is slightly too short and that the subsequent field period is slightly too long. This applies to picture recording and display devices having two magnetic heads. A similar phenomenon occurs in a teletext non-interlace 312/313 mode when using a computer controlled teletext decoder (CCT) in which the duration of the even fields is 312 line periods and the duration of the odd fields is 313 line periods instead of the interlace mode in which all fields have a duraton of 312½ line periods (European standard). Due to the different durations of the successive field periods the known amplitude control loop will set the picture height at a different value during each field and therefore cause an incorrect interlacing of the fields.

It is evident that the above-mentioned difficulty is caused by the high speed of the amplitude control loop. It is then obvious to decrease this speed. The interlace error is then reduced with an increasing integrated period. This implies, however, that the height of the picture slowly increases after the picture display device has been switched on, so that a distorted picture is visible for some time. This is very undesirable.

SUMMARY OF THE INVENTION

It is an object of the invention to provide a circuit arrangement of the type described above in which the control is sufficiently fast and in which the said instability in amplitude does not occur, not even in the case of a special mode of a picture recording and display device having more than two magnetic heads, and also in the case of 4:1 interlace instead of 2:1, as has been proposed. To this end the circuit arrangement according to the invention is characterized in that the circuit is provided with means for applying sampling pulses whose repetition frequency is substantially equal to the nth part of the field frequency, where n is an integer which is larger than 1.

Due to the measure according to the invention the speed of the amplitude control loop is still fairly high, provided that the number n is not too large. In fact, it will be evident to those skilled in the art that this number should not be chosen to be too large because a possible correction of the amplitude is not carried out before n field periods. Preferably, the number n will be a small multiple of 2. In teletext non-interlace 312/313 mode, for example, an amplitude is then obtained for an odd field which is slightly larger than that for an even field so that no interlace error occurs. In fact, the lines of a field are written on the lines of the previous field on the display screen, except of course the 313th line of the odd fields which does not carry any visible information.

In one embodiment the circuit arrangement according to the invention is characterized by an n-divider for passing each time each nth pulse of a signal applied thereto, which comprises pulses of substantially the field frequency.

The circuit arrangement is in an appropriate manner characterized in that in a field period in which a sampling pulse occurs this pulse occurs before a trigger pulse. It is not necessary for the two pulses to occur immediately one after the other.

DESCRIPTION OF THE DRAWING

The invention will be further described by way of example with reference to the accompanying Figures.

DETAILED DESCRIPTION

Figure 1:
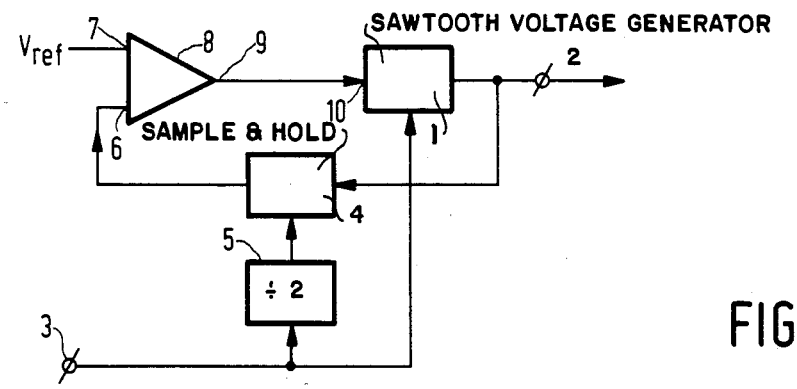
FIG. 1 shows a first embodiment of the circuit according to the invention.
Figure 2:
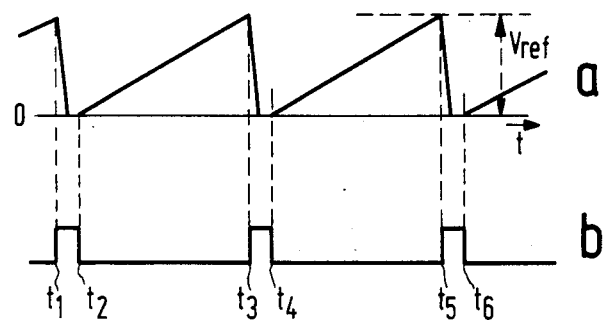
FIGS. 2 and 3 show waveforms occurring therein.

In FIG. 1 the reference numeral 1 denotes a sawtooth generator of a known type which makes the sawtooth-shaped signal of FIG. 2a available at an output terminal 2. This output signal is applied to stages (not shown) in which it is further processed for the field deflection in a picture display device, for example, a television receiver. Field synchronizing pulses (FIG. 2b) which have been derived, for example, from a received television signal are present at an input terminal 3. The signal of FIG. 2b may also be generated by a field synchronising circuit in synchronizing with the received field synchronizing signal. The signal at terminal 3 is applied as a trigger signal to generator 1. At an instant $t_1$ the leading edge of a synchronizing pulse occurs, so that the output signal at terminal 2 becomes low. When the trailing edge of the synchronizing pulse occurs at an instant $t_2$, generator 1 will start and generate a substantially linearly varying voltage.

The output signal at terminal 2 is also applied to a sample-and-hold circuit 4 and the field synchronizing signal at terminal 3 is also applied to a two-to-one divider 5 which passes every second field synchronizing pulse and applies this pulse to circuit 4 for its activation. At an instant $t_3$, which is one field period after instant $t_1$, the leading edge of a subsequent field synchronizing pulse occurs. This pulse is passed on by two-to-one divider 5 to circuit 4 in which the value of the sawtooth-shaped voltage at instant $t_3$ is measured and subsequently retained after which generator 1 is reset again. The value at the output of sample-and-hold circuit 4, which is thus the maximum value of the sawtooth shape, is applied to a first input 6 of a differential amplifier 8 formed as a comparison stage, a second input 7 of which is connected to a reference voltage $V_{ref}$. A signal dependent on the difference between the signals at the inputs 6 and 7 is present at an output 9 of stage 8, which signal is applied as a control signal to a control input 10 of sawtooth generator 1 for controlling the amplitude of the generated sawtooth-shaped voltage. This implies that if the peak value of the sawtooth shape measured at instant $t_3$ by circuit 4 deviates from the target value $V_{ref}$ thereof, the control signal applied to input 10 sets the slope of the sawtooth shape, more specifically from an instant $t_4$ when the trailing edge of the field synchronizing pulse commencing at instant $t_3$ occurs and when generator 1 is enabled again. Consequently, the peak value is set at the end of the field period. Generator 1 comprises, for example, a capacitor which is charged by a current source from instant $t_4$, the intensity of this current being controlled by the control signal. At an instant $t_5$, which is one field period after instant $t_3$, the leading edge of a subsequent field synchronizing pulse occurs. At that instant the sawtooth shape has the correct peak value.

The synchronizing pulse commencing at instant $t_5$ and ending at an instant $t_6$ is not passed by two-to-one divider 5. Thus, the sawtooth shape is not sampled at instant $t_5$ but one period later and a possible amplitude correction is effected at an instant which is one period later than instant $t_6$.

Figure 3:
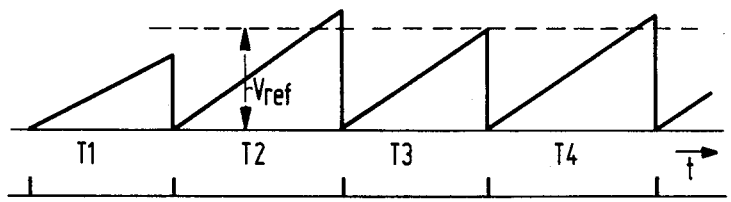

The foregoing applies in the case when the pulses of FIG. 2b occur regularly, on the understanding that the time intervals between instants $t_1$ to $t_3$, $t_3$ to $t_5$, $t_2$ to $t_4$, $t_4$ to $t_6$ etc. are identical. In this case the amplitude of the sawtooth-shaped voltage at terminal 2 is substantially constant. When the field synchronising pulses do not occur regularly, that is to say, when these time intervals are not identical, the amplitude will generally not be constant because a possible correction of the amplitude is not effected during each period. In the case of a special mode of a picture recording an display device or in teletext noninterlace 312/313 mode a field period, for example, between instants $t_1$ and $t_3$ is slightly too short and the subsequent field period, thus between instants $t_3$ and $t_5$, is slightly too long, but the sum of these durations, thus between instants $t_1$ and $t_5$ has a constant duration, i.e. 625 line periods in the second case mentioned. FIG. 3 shows in an exaggerated manner the output signal of the circuit of FIG. 1 under such circumstances. When at the end of a short field period T1 a peak value is measured which is too low relative to the reference value, the slope of the sawtooth shape is enlarged at the beginning of the subsequent field period T2. Since field period T2 is longer than field period T1, the peak value of the sawtooth shape obtained exceeds the value $V_{ref}$, but since sample-and-hold circuit 4 is then inoperative, this has no consequences for the slope of the sawtooth shape during the subsequent short field period T3. This sawtooth shape then has the correct amplitude. At the end of period T3 the voltage at input 6 therefore has the correct value so that no correction is performed at the beginning of the subsequent field period T4. From this it appears that the sawtooth shape, which is obtained during a short field period, has a slightly smaller amplitude than the sawtooth shape which is obtained during the subsequent, longer field period. Therefore no interlace error occurs. It will be evident that a similar result is obtained when sampling at the end of the long field periods or when initially a too high peak value is measured. For the sake of simplicity FIG. 3 shows the flyback period of the sawtooth shape in a very short form.

In the foregoing we dealt with the case of the incoming field synchronizing signal comprising pulses having a given repetition frequency, for example, the field frequency of 50 Hz prescribed by the European television standard in which the pulses occur with a time difference which may vary periodically. Actually, the frequency of 50 Hz is an approximated value for such a variation. When the incoming signal has thereafter a different frequency, for example, the field frequency of 60 Hz prescribed by the American television standard, a value certainly deviating from the reference value, i.e. in the example chosen a too low value is measured at the end of a field period. In this case the circuit of FIG. 1 behaves as described above for correcting the amplitude. In this respect it will be noted that this behaviour has been described in a theoretical manner: in practice the correct amplitude may be obtained after a longer period than is the case in FIG. 3. A further remark relates to the pulses applied to generator 1 and two-to-one divider 5. It will be evident that, as is apparent from the foregoing description, the sawtooth shape is to be sampled prior to resetting the generator 1. This can be achieved, for example, in that two-to-one divider 5 reacts to the leading edge of the pulse at terminal 3. While the resetting of generator 1 is initiated by the trailing edge of the pulse. However, it is not necessary for sampling to take place immediately before resetting the generator, that is to say, sampling can be effected at any instant in the period.

Figure 4:
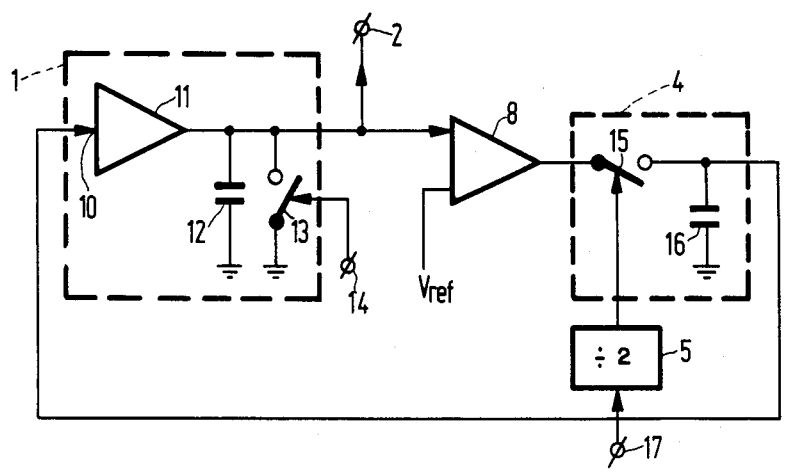
FIG. 4 shows a second embodiment of the circuit according to the invention.

FIG. 4 shows a further embodiment of the circuit in which the same elements as those in FIG. 1 have the same reference numerals. In FIG. 4 generator 1 comprises an amplifier 11 formed as a voltage current converter whose output current charges a capacitor 12. By means of a switch 13, for example, a transistor, capacitor 12 is subsequently short-circuited; for this purpose switch 13 is operated by pulses present at a terminal 14. Thus, a sawtooth-shaped voltage which is applied to a comparison stage 8 is available at the output terminal 2 of amplifier 11. Sample-and-hold circuit 4 is connected to the output of stage 8 and includes a switch 15, for example, a transistor, and a capacitor 16, the switch being operated by the pulses supplied by two-to-one divider 5. Two-to-one divider 5 receives pulses originating from a terminal 17. Stage 8 comprises a current source for charging capacitor 16 and the voltage present across capacitor 16 is applied to the control input 10 of amplifier 11 for setting the value of the charge current of capacitor 12 and consequently of the slope of the generated sawtooth-shaped voltage. A pulse then occurs at terminal 17 each time before the occurrence of a pulse at terminal 14. Two-to-one divider 5 a flipflop. Capacitor 16, which is operative as a store for the charge current of capacitor 12, may be replaced by a digital store element, for example, a counter.

According to a refinement of the circuit of FIG. 4 a switch is provided between the output of amplifier 11 and capacitor 12, which switch is operated by the sampling pulse from stage 5, and this in such a manner that the said switch conducts while switch 15 does not conduct, and conversely. The properties of the loop are thereby improved with respect to the circuit of FIG. 4.

The circuits of FIGS. 1 and 4 are suitable when the incoming field synchronizing signal has either the correct frequency of the variation shown in FIG. 3, that is to say, with a periodicity of the time difference between the pulses. This is ensured by two-to-one divider 5. However, a signal may be considered which originates from a picture recording and display device having four magnetic heads instead of two in a special mode of this device. In this case the two-to-one divider is replaced by a four-to-one divider which is formed with the aid of two bistable elements and which passes each fourth incoming pulse as a sampling pulse, which may also be applicable to the reception of a signal in accordance with a proposal made for a television system having a 4:1 instead of a 2:1 interlacing. Such a four-to-one divider may also be used with the signal of FIG. 3. It is true that the control speed is then further reduced, but it is still fairly high.

What is claimed is:

1. A circuit arrangement for generating a sawtooth-shaped signal for the field deflection in a picture display device with an amplitude which is substantially independent of the field frequency, the circuit arrangement comprising: a sawtooth generator which is triggerable by a field synchronizing signal and which has an output terminal for making the sawtooth-shaped signal available, comparison means for comparing the value of the sawtooth-shaped signal during the occurrence of a sampling pulse with a reference value and said comparison means applying a control signal to a control input of the sawtooth generator for controlling the slope of the generated sawtooth-shaped signal and means for applying sampling pulses whose repetition frequency is substantially equal to the nth part of the field frequency, where n is an integer which is larger than 1.

2. A circuit arrangement as claimed in claim 1, wherein the number n is a multiple of 2.

3. A circuit arrangement as claimed in claim 1, further comprising an n-divider for passing a sampling pulse the time each nth pulse of a field synchronizing signal is applied thereto, which comprises pulses of substantially the field frequency.

4. A circuit arrangement as claimed in claim 1, wherein during a field period in which a sampling pulse occurs, said sampling pulse occurs before a trigger pulse.

5. A circuit arrangement as claimed in claim 1, wherein the comparison means comprises a sample-and-hold circuit which is activated each time by the sampling pulses and which is coupled to the output terminal, the output of the sample-and-hold circuit being connected to an input of a comparison stage, and another input of which is connected to said reference value.

6. A circuit arrangement as claimed in claim 1, wherein the comparison means comprises a comparison stage, an input of which is connected to the output terminal and another input of which is connected to a reference value, an output being connected to a sample-and-hold circuit which is activated each time by the sampling pulses, the output of the sample-and-hold circuit being coupled to the control input of the sawtooth generator.

* * * * *